US011552208B2

(12) United States Patent
Au

(10) Patent No.: US 11,552,208 B2
(45) Date of Patent: Jan. 10, 2023

(54) SOLAR MODULE CLAMP

(71) Applicant: NEXTracker Inc., Fremont, CA (US)

(72) Inventor: Alexander W. Au, Oakland, CA (US)

(73) Assignee: NEXTRACKER LLC, Fremont, CA (US)

( * ) Notice: Subject to any disclaimer, the term of this patent is extended or adjusted under 35 U.S.C. 154(b) by 0 days.

(21) Appl. No.: 17/475,327

(22) Filed: Sep. 14, 2021

(65) Prior Publication Data
US 2022/0077335 A1 Mar. 10, 2022

Related U.S. Application Data

(63) Continuation of application No. 15/960,411, filed on Apr. 23, 2018, now Pat. No. 11,121,273, which is a continuation of application No. 14/095,953, filed on Dec. 3, 2013, now Pat. No. 9,954,127.

(60) Provisional application No. 61/733,373, filed on Dec. 4, 2012.

(51) Int. Cl.
*H01L 31/042* (2014.01)
*F24S 25/632* (2018.01)
*F24S 25/615* (2018.01)
*H02S 30/00* (2014.01)
*H02S 20/30* (2014.01)
*F24S 25/60* (2018.01)

(52) U.S. Cl.
CPC .......... *H01L 31/042* (2013.01); *F24S 25/615* (2018.05); *F24S 25/632* (2018.05); *H02S 20/30* (2014.12); *H02S 30/00* (2013.01); *F24S 2025/6001* (2018.05); *F24S 2025/6006* (2018.05); *Y02E 10/50* (2013.01)

(58) Field of Classification Search
CPC .............................. H01L 31/042; H02S 20/30
See application file for complete search history.

(56) References Cited

U.S. PATENT DOCUMENTS

| | | |
|---|---|---|
| 3,955,250 A | 5/1976 | Heckethorn |
| 2006/0054162 A1 | 3/2006 | Romeo et al. |
| 2009/0293941 A1 | 12/2009 | Luch |
| 2010/0065108 A1 | 3/2010 | West et al. |
| 2011/0204193 A1 | 8/2011 | Sagayama |
| 2012/0298817 A1 | 11/2012 | West et al. |

FOREIGN PATENT DOCUMENTS

WO 2010053089 A1 5/2010

*Primary Examiner* — Tae-Sik Kang
(74) *Attorney, Agent, or Firm* — Weber Rosselli & Cannon LLP

(57) ABSTRACT

A solar module configured in a frame assembly with multi-configuration attachment member(s), which has locking and unlocking characteristics.

14 Claims, 10 Drawing Sheets

SOLAR MODULE CLAMP

CROSS-REFERENCE TO RELATED APPLICATIONS

The present invention is a continuation of and claims priority to U.S. patent application Ser. No. 15/960,411, filed Apr. 23, 2018, now U.S. Pat. No. 11,121,273, which is a continuation of and claims priority to U.S. application Ser. No. 14/095,953 filed Dec. 3, 2013, now U.S. Pat. No. 9,954,127, which is a non-provisional of U.S. Provisional Application No. 61/733,373 filed Dec. 4, 2012, which are incorporated by reference herein for all purposes.

BACKGROUND

The present application relates generally to an attachment assembly for solar panels. More specifically, embodiments of the present invention provide an attachment assembly for framing solar modules.

As the population of the world increases, industrial expansion has lead to an equally large consumption of energy. Energy often comes from fossil fuels, including coal and oil, hydroelectric plants, nuclear sources, and others. As an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use come from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies have been developed to capture solar energy, concentrate it, store it, and convert it into other useful forms of energy.

Solar panels have been developed to convert sunlight into energy. As an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successfully for certain applications, there are still limitations. Often, solar panels are often difficult to assembly and maintain in the field. Cumbersome frames, attachment members, and assembly techniques are often required. Unfortunately, conventional solar tracking assembly techniques are often inadequate. These and other limitations are described throughout the present specification, and may be described in more detail below.

From the above, it is seen that techniques for improving solar systems are highly desirable.

SUMMARY OF THE INVENTION

According to the present application, techniques related generally to an attachment assembly for solar panels are provided. More specifically, embodiments of the present invention provide an attachment assembly for framing solar modules.

In an example, the present invention provides a frame assembly including attachment members to configure at least a pair of solar modules in an array.

In an example, the present assembly uses a pair of rails that can be configured or mounted on either long or short side of an assembly device. In an example, the rails can be pre-mounted with the assembly device lock in place. In an example, the rail to the module can be accomplished with module centerline scribe on the frame. In an example, a pair of nuts to the U-bolts is provided to be mounted during tracker installation. In an example, the present assembly provides for easy access to bolts during tightening, subsequent module attached after bolts tightened. In an example, solar modules can be locked into place during installation.

In an example, the present invention provides a solar module system, e.g., tracker. The system has a first solar module comprising a first frame structure configured with a first groove region disposed therein. The system has a second solar module comprising a second frame structure configured with a second groove region disposed therein. The first and second modules are among a plurality of modules in one or more examples.

In an example, the system has an attachment member (e.g., member with cam structure for interlocking or other attachment configuration). The attachment member comprises a first end region having a first spatial configuration and a second end region having a second spatial configuration. The attachment member comprises a length provided between the first end region and the second end region. The first end region is configured to integrate the first spatial region configuration with the first groove region by intimately coupling the first spatial region with the first groove region by initiating the intimate coupling along a first spatial direction relative to the first groove region. In an example, the second end region is configured to intimately couple to the second groove region by initiating the intimate coupling along a second spatial direction that is different from the first spatial direction, while the initiating of the initiating of the intimate coupling in the second spatial direction occurs while the first spatial region is firmly engaged with the first groove.

Various additional objects, features and advantages of the present invention can be more fully appreciated with reference to the detailed description and accompanying drawings that follow.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF THE SPECIFIC EMBODIMENTS

According to the present application, techniques related generally to an attachment assembly for solar panels are provided. More specifically, embodiments of the present invention provide an attachment assembly for framing solar modules.

Figure 1:
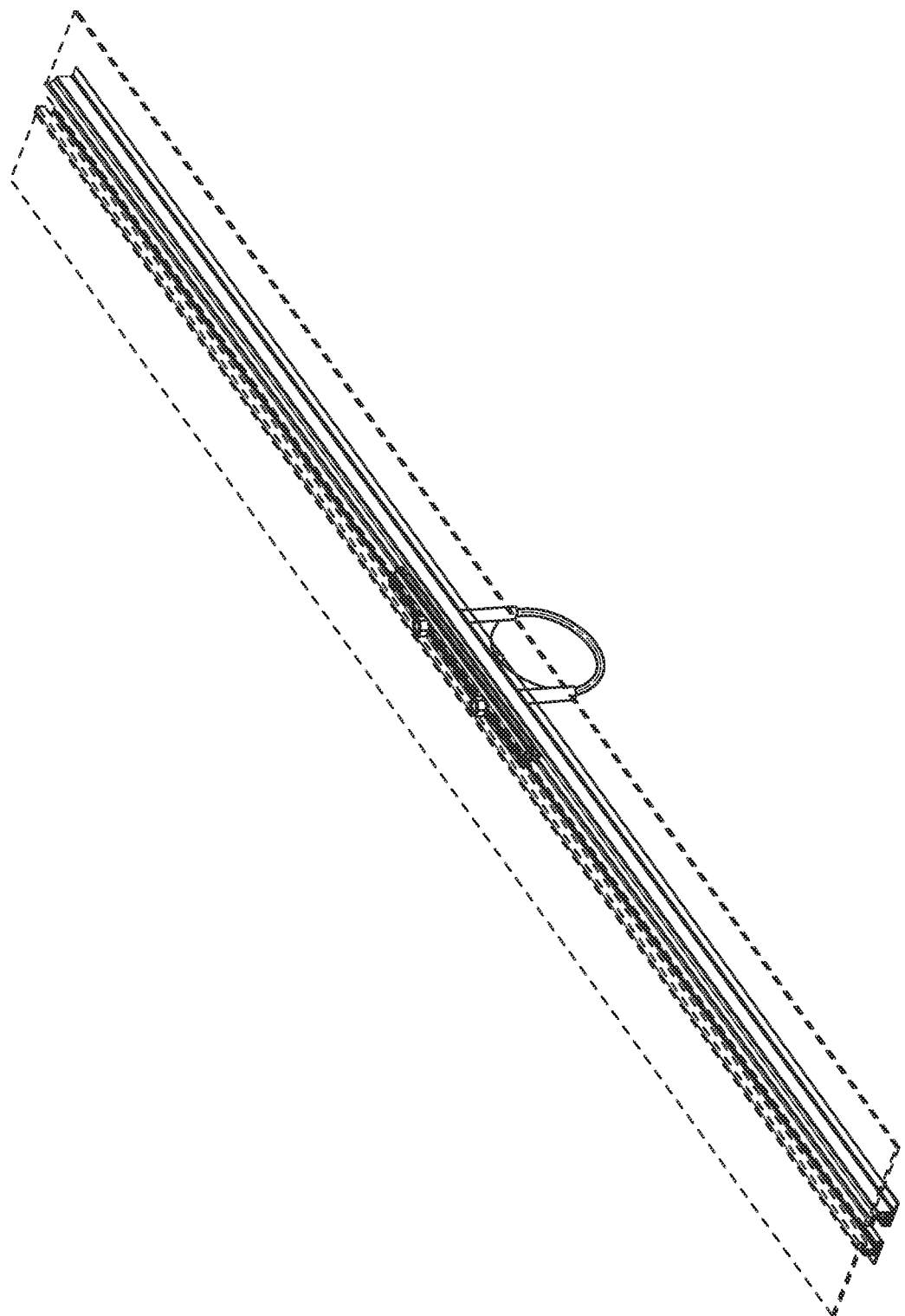
FIG. 1 is a simplified perspective view of a frame assembly (including indications for x-y-z directions) for a plurality of solar modules according to an embodiment of the present invention.

FIG. 1 is a simplified perspective view of a frame assembly (including indications for x-y-z directions) for a plurality of solar modules according to an embodiment of the present invention. As shown, the frame assembly includes a pair of frame rail assemblies coupled together using an attachment member, which interlocks each of the frame rail assemblies together with the module frames. Additionally, the frame rail assemblies include a pair of openings for a U-bolt and clamp or other member to couple the rail assembly to a pipe or other member of a tracker or solar system. Of course, there can be other variations.

Figure 2:
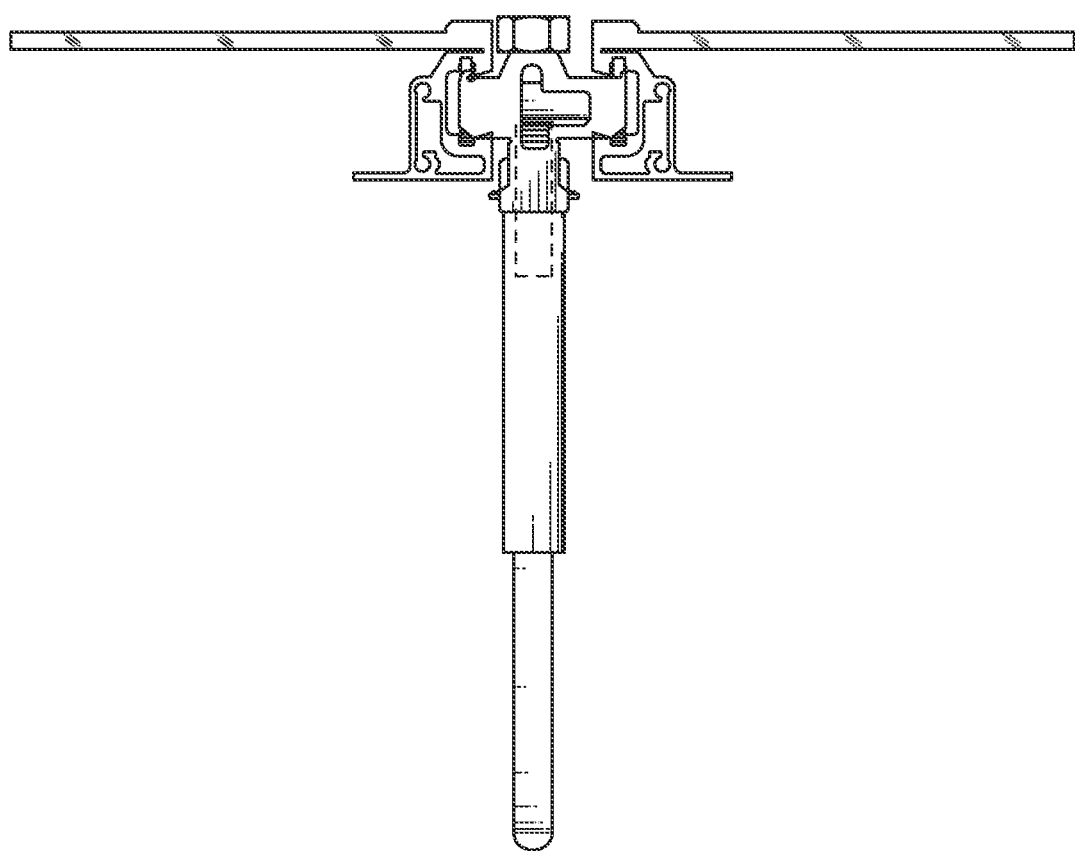
FIG. 2 is a more detailed view along the x-y direction for the frame assembly including attachment member according to an embodiment of the present invention.

FIG. 2 is a more detailed view along the x-y direction for the frame assembly including attachment member according to an embodiment of the present invention. In an example as shown is a direct normal view in plane of a module glass. In an example, as shown in a center region is a cam. The cam can either work for two modules, or just one if construction tolerance is needed for spacing the modules along the torque tube. Of course, there can be other variations. Further details of the present assembly can be found throughout the present specification and more particularly below.

Figure 3:
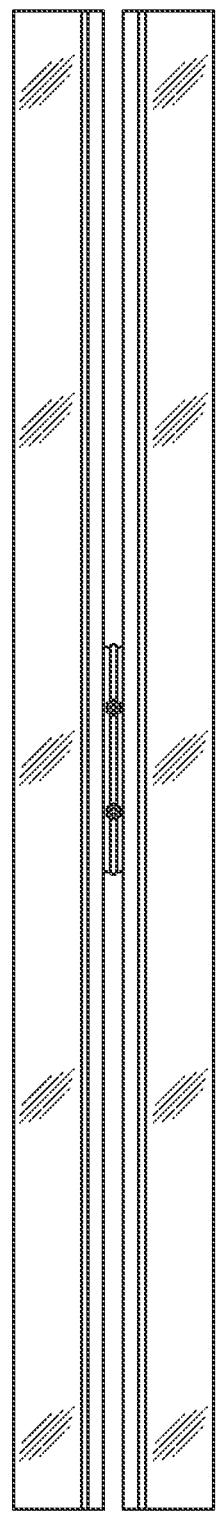
FIG. 3 is a more detailed view of an x-z direction or "top view" for the frame assembly according to an embodiment of the present invention.

FIG. 3 is a more detailed view of an x-z direction or "top view" for the frame assembly according to an embodiment of the present invention. As shown, the frame assembly includes a pair of frames each of which is configured on an edge of a solar module. The assembly also includes a pair of rails sandwiched between the frames. An attachment member, which is configured between the rails holds the frame assembly together, as shown.

Figure 4:
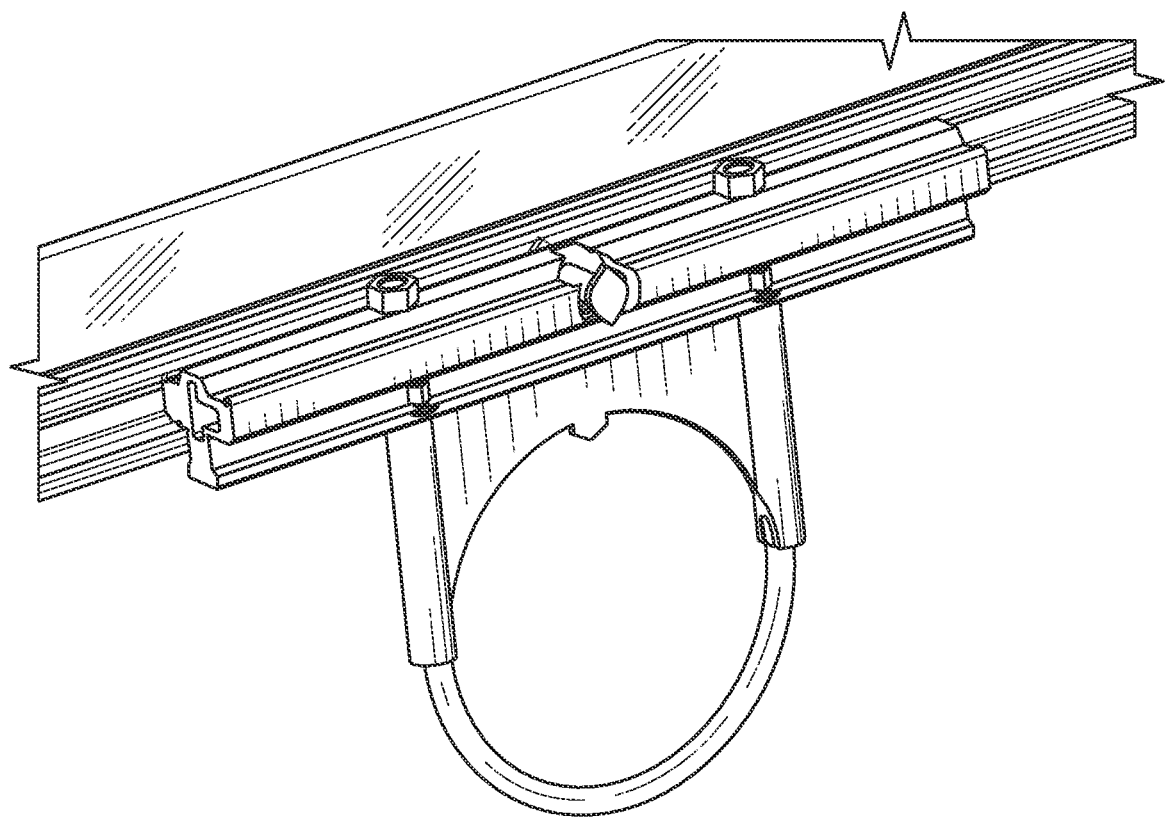
FIG. 4 is an exposed perspective view of the frame assembly (including indications for x-y-z direction) where one of the solar modules has been removed according to an embodiment of the present invention.

FIG. 4 is an exposed perspective view of the frame assembly (including indications for x-y-z direction) where one of the solar modules has been removed according to an embodiment of the present invention. In an example, one of the modules has been removed. In an example, an extruded panel rail bracket is shown, which is configured to a module frame. The cam configured to the panel rail is also shown. In an example, the cam can either fasten to one rail or both rails. In an example, the rail mounts to a U-bolt and U-bolt clamp, which are configured through the rail along a direction normal to the direction of the length of the rail. In an example, the cam will serve as an electrical bonding path, as well as a mechanical lock to prevent the bracket from sliding out of the module groove. In an example, the U-bolt clamp will be secured to a support member (or pipe type member) of a tracker.

Figure 5:
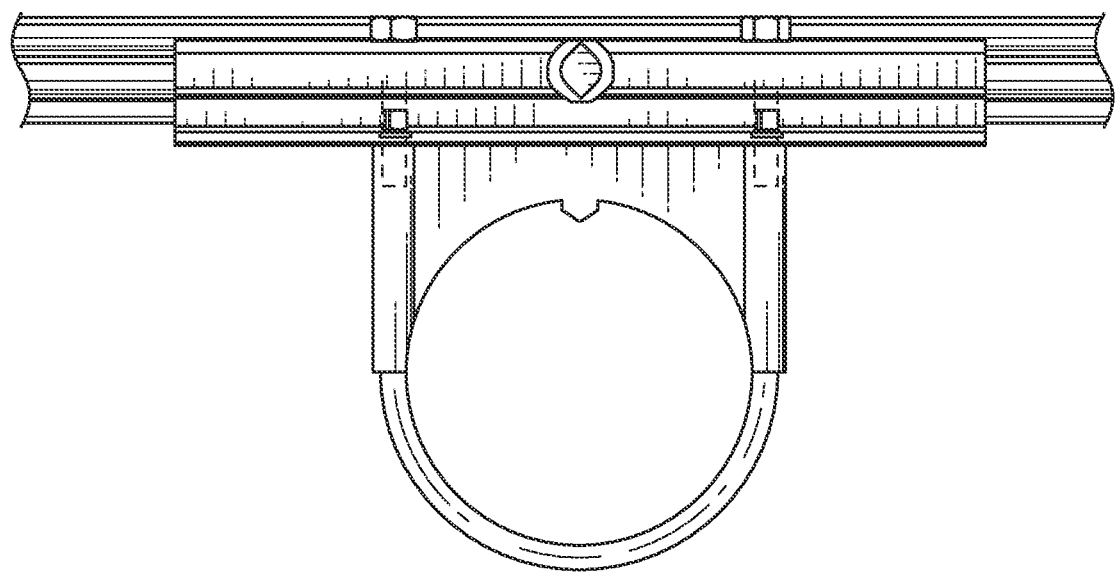
FIG. 5 is an exposed side view of the frame assembly where one of the solar modules has been removed according to an embodiment of the present invention.

FIG. 5 is an exposed side view of the frame assembly where one of the solar modules has been removed according to an embodiment of the present invention. As shown, the exposed side view is configured as a site for a second solar module to couple to the pair of rail structures, which can be separate units or integrated together, depending upon the embodiment.

In an example, the system has an attachment member (e.g., member with cam structure for interlocking or other attachment configuration). The attachment member comprises a first end region having a first spatial configuration and a second end region having a second spatial configuration. The attachment member comprises a length provided between the first end region and the second end region. The first end region is configured to integrate the first spatial region configuration with the first groove region by intimately coupling the first spatial region with the first groove region by initiating the intimate coupling along a first spatial direction relative to the first groove region. In an example, the second end region is configured to intimately couple to the second groove region by initiating the intimate coupling along a second spatial direction that is different from the first spatial direction, while the initiating of the initiating of the intimate coupling in the second spatial direction occurs while the first spatial region is firmly engaged with the first groove.

In an example, the first spatial configuration comprises a first locking device, which has a locking structure configured to operably couple to the first groove structure in a locking position rather than an unlocked position. In an example, the second spatial configuration comprises a second locking device configured to operably couple to the second groove structure in a locking position rather than an unlocked position. In an example only, the attachment member can be similar or the same as those provided by Zep Solar, Inc., although there can be others manufacturers.

In an example, the first groove region comprises a first recessed region disposed between a first pair of elevated regions. In an example, the second groove region comprises a second recessed region between a second pair of elevated regions.

In an example, the first frame structure is configured around a periphery of the first solar module. In an example, the second frame structure is configured around a periphery of the second solar module.

In an example, the first groove region is similar in shape and size as the second groove region.

In an example, the first frame structure and the second frame structure comprise, respectively, a first rail structure and a second rail structure coupled together using the attachment member.

In an example, the first rail structure and the second rail structure comprising a pair of openings to operably couple a U-bolt and clamp assembly to be configured to a support member.

In an example, the support member is provided on a tracker system.

In an example, the U-bolt and claim assembly comprises a pair of extension members, each of the extension members having an opening, the opening being configured to allow an attachment device to be inserted there through to couple a portion of each of the first frame structure and second frame structure together. Further details of the attachment member is described throughout the present specification and more particular below.

Figure 6:
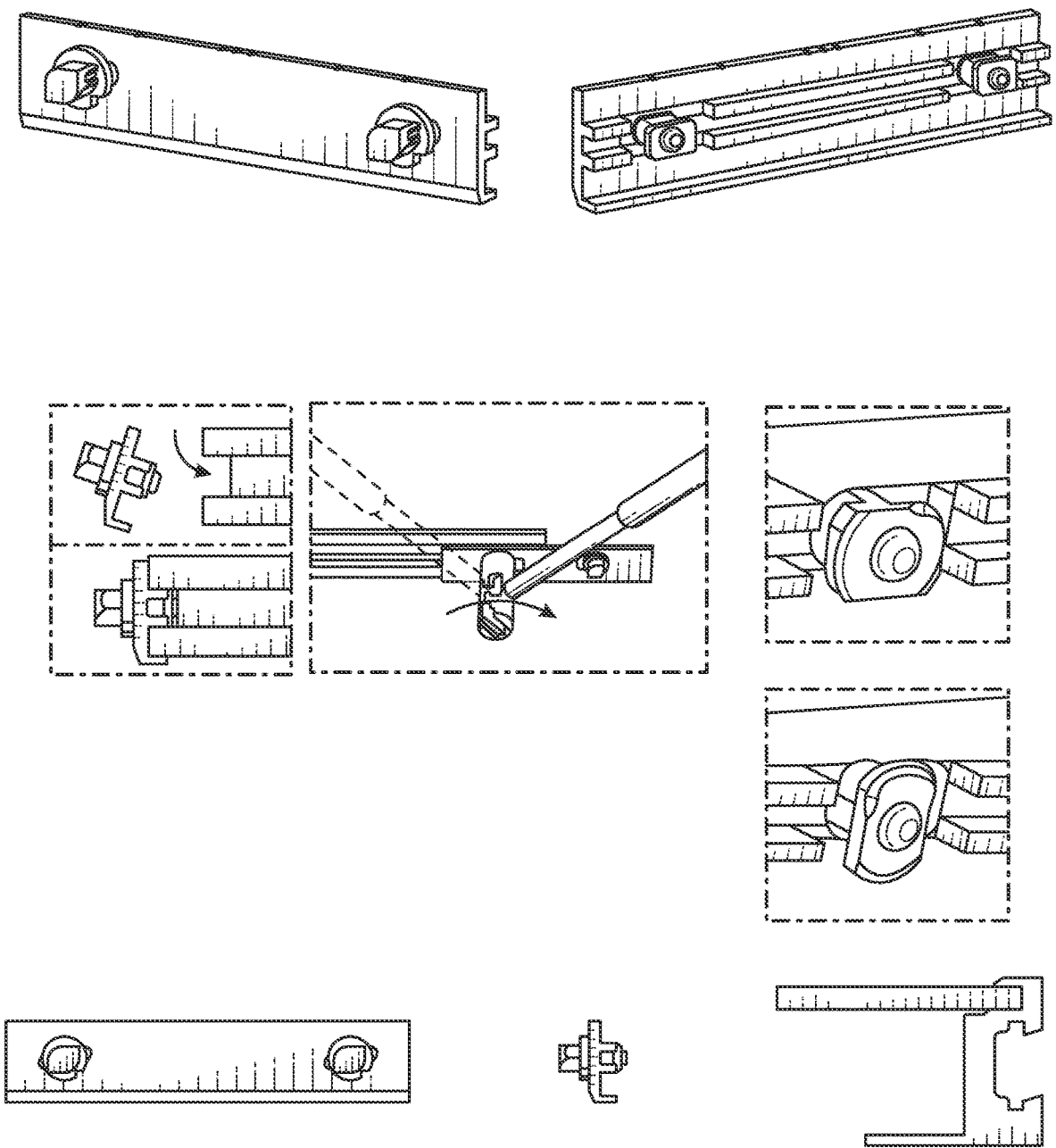
FIG. 6 is a simplified diagram of an attachment member and illustration of coupling the attachment member to a solar module frame according to an embodiment of the present invention.

FIG. 6 is a simplified diagram of an attachment member and illustration of coupling the attachment member to a solar module frame according to an embodiment of the present invention. As shown is the attachment member in an example, using a tongue and key side. The attachment member is operably coupled to a rail member, which is provided for an assembly. The attachment member and rail are operably couple to a first solar module, which is then configured to a second solar module, as described.

Figure 7:
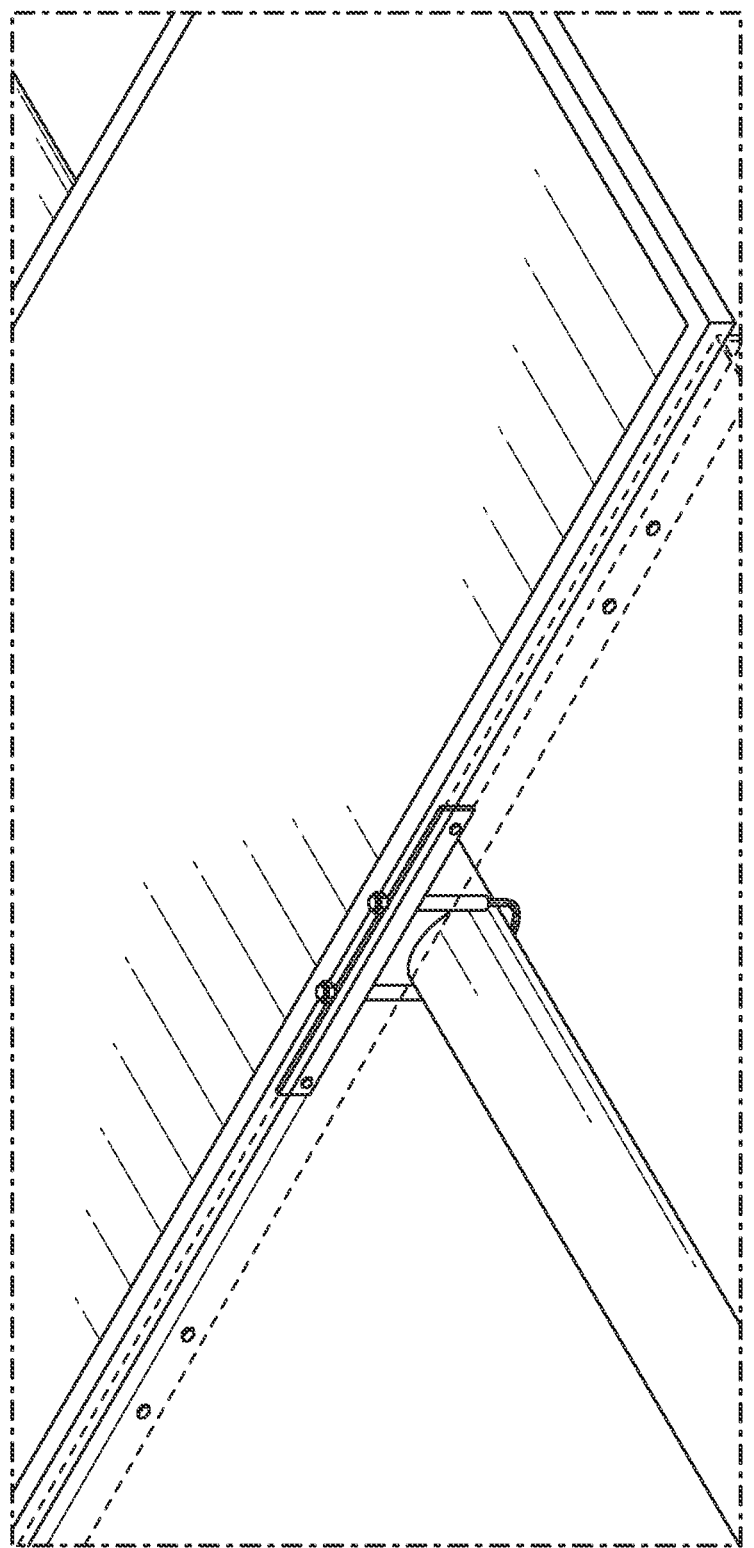
FIG. 7 is perspective view of clamping assembly according to an alternative embodiment of the present invention.

FIG. 7 is perspective view of clamping assembly according to an alternative embodiment of the present invention. As shown, the U-bolt and clamp assembly comprises a pair of extension members integrated with the U-bolt and clamp assembly. Each of the extension members having an opening disposed within the extension member. The opening is configured to allow an attachment device to be inserted there through to couple a portion of each of the first frame structure and second frame structure together such that the clamp assembly, pair of rails, and frames form a sandwich structure.

Figure 8:
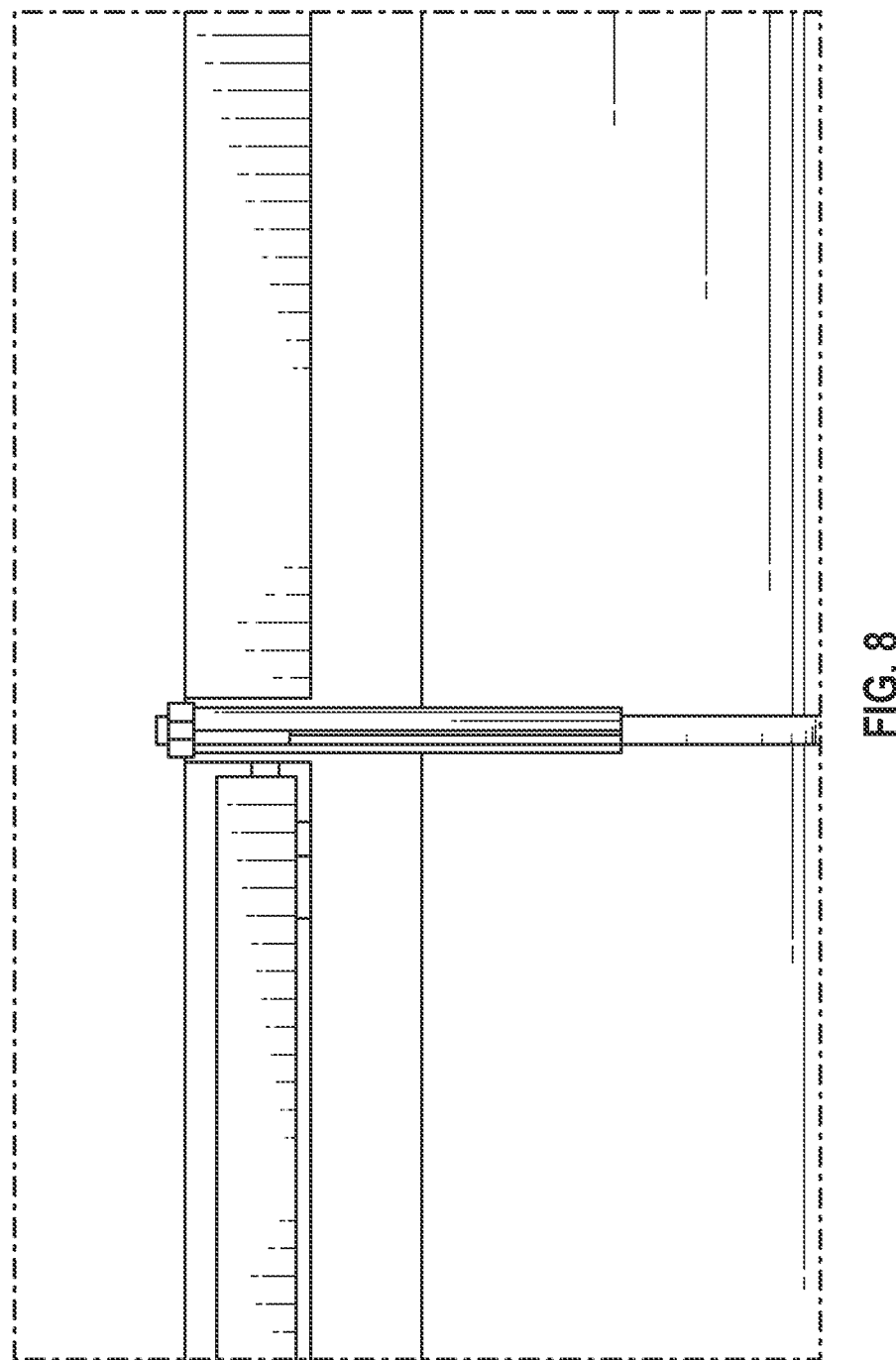
FIG. 8 is a side view of the clamping assembly according to the alternative embodiment.

FIG. 8 is a side view of the clamping assembly according to the alternative embodiment.

Figure 9:
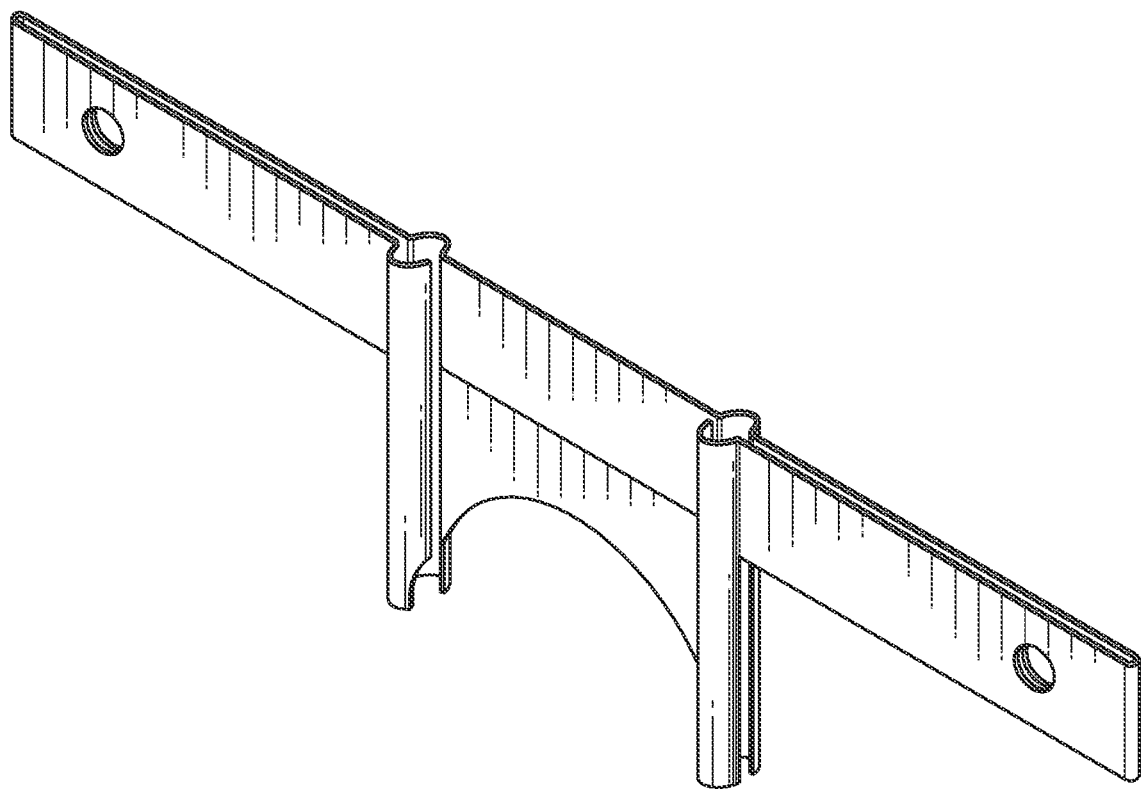
FIGS. 9 and 10 illustrate, respectively, a perspective view and a top-view of a clamp according to the alternative embodiment.
Figure 10:

FIGS. 9 and 10 illustrate, respectively, a perspective view and a top-view of a clamp according to the alternative embodiment.

It is understood that the examples and embodiments described herein are for illustrative purposes only and that various modifications or changes in light thereof will be suggested to persons skilled in the art and are to be included within the spirit and purview of this application and scope of the appended claims. In an example, each of the elements can be made of a suitable material such as metal, stainless steel, iron, aluminum, or alloys thereof, among others, which are sufficiently rigid and weather proof.

I claim:

1. A solar tracker system comprising:
a first solar module including a first frame structure with a first groove disposed in the first frame structure;
a second solar module including a second frame structure with a second groove disposed in the second frame structure; and
an attachment member having:
a body having a length provided between a first end region and a second end region, and including a clamp assembly, wherein the clamp assembly includes a pair of planar extension members, each of the pair of planar extension members having an opening, the opening configured to allow an attachment device to be inserted therethrough to couple the body to the first and second solar modules;
a first rail coupled to a first side surface of the body and extending along the length of the body, the first rail configured to fit inside of the first groove;
a second rail coupled to a second side surface of the body opposite the first side surface and extending along the length of the body, the second rail configured to fit inside of the second groove; and
a U-bolt having a first end portion and a second end portion,
wherein the clamp assembly further includes a pair of channels configured to receive the respective first and second end portions of the U-bolt, and a planar portion coupled between the pair of channels, wherein the U-bolt and clamp assembly are configured to receive a support member of a solar tracker between the U-bolt and the clamp assembly.

2. The solar tracker system of claim 1, further comprising a first locking device disposed within a first space of the first rail, the first locking device configured to operably couple the body of the attachment member to the first groove of the first solar module.

3. The solar tracker system of claim 1, further comprising a second locking device disposed within a second space of the second rail, the second locking device configured to operably couple the body of the attachment member to the second groove of the second solar module.

4. The solar tracker system of claim 1, wherein the first and second rails extend in parallel along the length of the body.

5. The solar tracker system of claim 1, wherein the first groove comprises a first recessed region disposed between a first pair of elevated regions; and
wherein the second groove comprises a second recessed region between a second pair of elevated regions.

6. The solar tracker system of claim 1, wherein the first frame structure is configured around a periphery of the first solar module; and
wherein the second frame structure is configured around a periphery of the second solar module.

7. The solar tracker system of claim 1, wherein the first groove is similar in shape and size as the second groove.

8. The solar tracker system of claim 1, wherein the clamp assembly includes a first pair of semicircular recesses formed in a middle portion of a planar-shaped material and a corresponding second pair of semicircular recesses formed at respective end portions of the planar-shaped material on the same side of the planar-shaped material, wherein the planar-shaped material is folded at locations between the first pair of semicircular recesses and the second pair of semicircular recesses, respectively, such that the first pair of semicircular recesses and the respective second pair of semicircular recesses form the respective pair of channels.

9. The solar tracker system of claim 1, wherein the opening is configured to allow an attachment device to be inserted therethrough to couple a portion of each of the first and second frame structures together such that the clamp assembly, the first and second rails, and the first and second frame structures form a sandwich structure.

10. A solar tracker system comprising:
a first solar module including a first frame structure with a first groove disposed in the first frame structure;
a second solar module including a second frame structure with a second groove disposed in the second frame structure; and an attachment member including:
- a clamp assembly having a length provided between a first end region and a second end region, each of the first end region and the second end region having an opening, the opening configured to allow an attachment device to be inserted therethrough to couple the clamp assembly to the first and second solar modules;
- a first rail coupled to a first side surface of the clamp assembly and extending along the length of the clamp assembly, the first rail configured to fit inside of the first groove;
- a second rail coupled to a second side surface of the clamp assembly opposite the first side surface and extending along the length of the clamp assembly, the second rail configured to fit inside of the second groove; and
- a U-bolt having a first end portion and a second end portion,
- wherein the clamp assembly further includes a pair of channels configured to receive the respective first and second end portions of the U-bolt, and a planar portion coupled between the pair of channels, wherein the U-bolt and clamp assembly are configured to receive a support member of a solar tracker between the U-bolt and the clamp assembly.

11. The solar tracker system of claim 10, wherein the clamp assembly includes a first pair of semicircular recesses formed in a middle portion of a planar-shaped material and a corresponding second pair of semicircular recesses formed at respective end portions of the planar-shaped material on the same side of the planar-shaped material, wherein the planar-shaped material is folded at locations between the first pair of semicircular recesses and the second pair of semicircular recesses, respectively, such that the first pair of semicircular recesses and the respective second pair of semicircular recesses form the respective pair of channels.

12. The solar tracker system of claim 10, wherein the opening is configured to allow an attachment device to be inserted therethrough to couple a portion of each of the first and second frame structures together such that the clamp assembly, the first and second rails, and the first and second frame structures form a sandwich structure.

13. An attachment member for attaching at least one solar module to a support member of a solar tracker, the attachment member comprising:
- a clamp assembly having a length provided between a first end region and a second end region, each of the first end region and the second end region having an opening, the opening configured to allow an attachment device to be inserted therethrough to couple the clamp assembly to the at least one solar module;
- a first rail coupled to a first side surface of the clamp assembly and extending along the length of the clamp assembly, the first rail configured to fit inside of a first groove of a first solar module;
- a second rail coupled to a second side surface of the clamp assembly opposite the first side surface and extending along the length of the claim assembly, the second rail configured to fit inside of a second groove of a second solar module; and
- a U-bolt having a first end portion and a second end portion,
- wherein the clamp assembly further includes a pair of channels configured to receive the respective first and second end portions of the U-bolt, and a planar portion coupled between the pair of channels, wherein the U-bolt and clamp assembly are configured to receive a support member of a solar tracker between the U-bolt and the clamp assembly.

14. The attachment member of claim 13, wherein the clamp assembly includes a first pair of semicircular recesses formed in a middle portion of a planar-shaped material and a corresponding second pair of semicircular recesses formed at respective end portions of the planar-shaped material on the same side of the planar-shaped material, wherein the planar-shaped material is folded at locations between the first pair of semicircular recesses and the second pair of semicircular recesses, respectively, such that the first pair of semicircular recesses and the respective second pair of semicircular recesses form the respective pair of channels.

* * * * *